(12) United States Patent
Kitamura et al.

(10) Patent No.: US 7,738,263 B2
(45) Date of Patent: Jun. 15, 2010

(54) CIRCUIT MODULE AND PROCESS FOR PRODUCING THE SAME

(75) Inventors: Yoichi Kitamura, Tokyo (JP); Minoru Hashimoto, Tokyo (JP); Tatsuya Kaneko, Kanagawa (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 52 days.

(21) Appl. No.: 12/007,972

(22) Filed: Jan. 17, 2008

(65) Prior Publication Data
US 2008/0174983 A1   Jul. 24, 2008

(30) Foreign Application Priority Data
Jun. 28, 2007   (JP) ............... 2007-170190

(51) Int. Cl.
*H05K 9/00*   (2006.01)
(52) U.S. Cl. ............... 361/816; 361/777; 361/760
(58) Field of Classification Search ............... 361/816, 361/777, 760; 257/703–704; 174/261
See application file for complete search history.

(56) References Cited

U.S. PATENT DOCUMENTS

| | | | |
|---|---|---|---|
| 4,868,639 A | 9/1989 | Mugiya et al. | |
| 6,747,350 B1 * | 6/2004 | Lin et al. | 257/704 |
| 6,817,091 B2 * | 11/2004 | Fitzgerald et al. | 29/840 |
| 6,953,985 B2 | 10/2005 | Lin et al. | |
| 2005/0057883 A1 * | 3/2005 | Bolken et al. | 361/301.3 |
| 2005/0263878 A1 * | 12/2005 | Potter | 257/704 |
| 2007/0164637 A1 * | 7/2007 | Onozawa | 310/344 |

FOREIGN PATENT DOCUMENTS

| | | |
|---|---|---|
| JP | 7-73123 | 8/1995 |
| JP | 2001-68576 | 3/2001 |

* cited by examiner

*Primary Examiner*—Jinhee J Lee
*Assistant Examiner*—Andargie M Aychillhum
(74) *Attorney, Agent, or Firm*—Buchanan Ingersoll & Rooney PC

(57) ABSTRACT

A circuit module containing a ceramic carrier substrate to carry electronic parts, ceramic substrate pads provided on a surface of the ceramic carrier substrate, and a lid having a cavity and a bottom surface joined to the ceramic substrate pads with solder, the lid being a stepped lid having protrusions adjacent to the cavity, and dents adjacent to the cavity with the protrusions intervening therebetween, the protrusions being in contact with the ceramic carrier substrate with a prescribed distance to the ceramic substrate pads, and the dents being joined to the ceramic substrate pads with solder.

2 Claims, 8 Drawing Sheets

100

100

300

CIRCUIT MODULE AND PROCESS FOR PRODUCING THE SAME

BACKGROUND OF THE INVENTION

1. Field of the Invention

The present invention relates to a circuit module incorporating electronic parts, and a process for producing the same, and more specifically, it relates to a circuit module that is prevented from suffering invasion of foreign matters into a cavity, and a process for producing the same.

2. Description of Related Art

A high-frequency circuit module used for communication equipments, artificial satellites, radar equipments and the like necessarily has high reliability and prolonged service life. Accordingly, circuit regions thereof having high-frequency electronic parts mounted therein are hermetically sealed with a cap having a cavity.

The cap of the high-frequency circuit module is formed of a metal or a dielectric material having an electroconductive surface for blocking leakage of electromagnetic waves from the high-frequency electronic parts and for shielding the high-frequency electronic parts from interference of external electromagnetic waves. It is necessary to prevent the circuit regions of the high-frequency circuit module from suffering interference of electromagnetic waves among the respective circuit regions. Accordingly, the cavity is divided into plural cells by barriers, and the circuit regions are housed in the divided cells, respectively.

For example, such a high-frequency circuit module has been known that has high-frequency circuit regions hermetically sealed with a metallic flat container main body having pin terminals hermetically sealed, and a metallic cap (which is hereinafter referred to as a lid) having plural cavities formed with partitions (as described, for example, in JP-B-07-073123 (page 2 and FIG. 1)).

In the high-frequency circuit module, the terminals for retrieving signals are hermetically sealed since the flat container main body is formed of a metal. In recent years, however, a dielectric material substrate, instead of a metal, is used as the flat container main body for simplifying the production process of the container main body and for reduction of the cost thereof.

For example, such a hermetically sealed semiconductor device has been known in that a ceramic substrate having a circuit pattern for mounting electronic parts is used as the flat container main body of a dielectric material substrate (as described, for example, in JP-A-2001-68576 (page 3 and FIG. 1)).

A dielectric material substrate, such as a ceramic substrate, used as the flat container main body cannot be joined to the lid by welding, which has been used for joining a metallic container main body, and therefore, the flat container main body is joined to the lid with solder or adhesive.

In the case where the ceramic substrate as the flat container main body is joined to the lid with solder, however, a solder paste is used, and voids due to remaining flux contained in the solder paste burst upon heating for joining, whereby solder balls are scattered within the space inside the cavity having the electronic parts housed therein. The flux remaining in the solder layer is also scattered within the space inside the cavity having the electronic parts housed therein. The solder balls and the flux scattered within the space inside the cavity bring about a problem on operation and characteristics of the electronic parts sealed in the cavity.

In the case where the ceramic substrate as the flat container main body is joined to the lid with adhesive, an electroconductive resin is used for joining. In this case, voids formed in the electroconductive resin due to coating of the electroconductive resin burst upon joining the flat container main body and the lid, and particles of the electroconductive resin are scattered within the space inside the cavity having the electronic parts housed therein and bring about a problem on operation and characteristics of the electronic parts sealed in the cavity.

SUMMARY OF THE INVENTION

The present invention has been made to solve the above-discussed problems, and an object thereof is to provide such a highly reliable circuit module in that a flat container body formed of a dielectric material substrate, such as a ceramic substrate, is joined to a lid, and electronic parts hermetically sealed inside the container do not suffer a problem on operation and characteristics thereof due to soldering or adhesion, and also to provide a process for producing the circuit module.

The present invention relates to, according to one aspect, a circuit module containing a ceramic carrier substrate to carry electronic parts, ceramic substrate pads provided on a surface of the ceramic carrier substrate, and a lid having a cavity and a bottom surface joined to the ceramic substrate pads with solder, the lid being a stepped lid having protrusions adjacent to the cavity, and dents adjacent to the cavity with the protrusions intervening therebetween, the protrusions being in contact with the ceramic carrier substrate with a prescribed distance to the ceramic substrate pad, and the dents being joined to the ceramic substrate pads with solder.

The circuit module according to one aspect of the present invention has a lid that is a stepped lid having protrusions adjacent to the cavity, and dents adjacent to the cavity with the protrusions intervening therebetween. The protrusions are in contact with the ceramic carrier substrate with a prescribed distance to the ceramic substrate pads, and the dents are joined to the ceramic substrate pads with solder. According to the constitution, even in the case where voids incorporated in precoated solder layers used for joining the lid to the ceramic carrier substrate burst, particles of molten solder in a liquid state and a remaining flux component are prevented from being scattered within the cavity, and high reliability can be obtained without short circuit or corrosion due to the scattered substances.

The foregoing and other objects, features, aspects and advantages of the present invention will become more apparent from the following detailed description when read in conjunction with the accompanying drawings.

DESCRIPTION OF THE PREFERRED EMBODIMENTS

Embodiment 1

Figure 1:
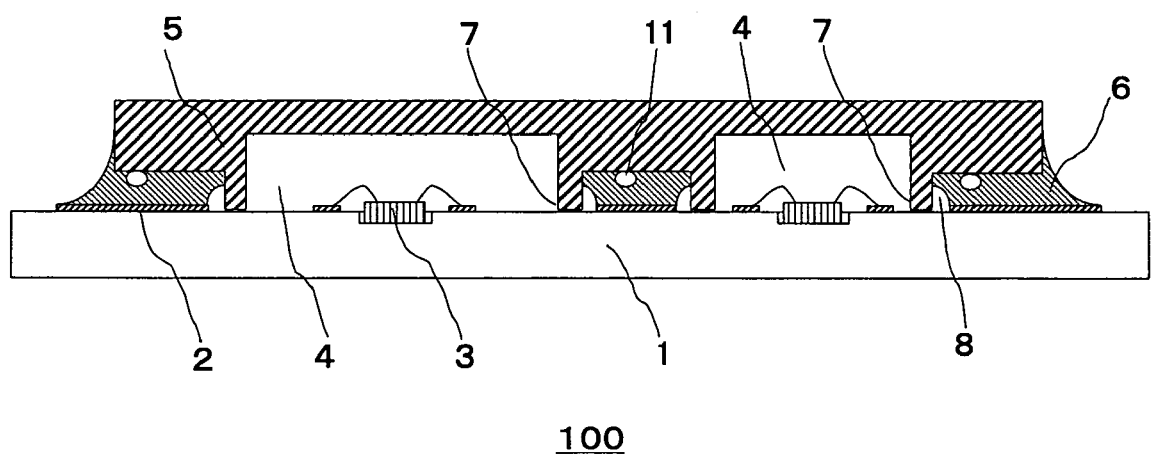
FIG. 1 is a schematic cross sectional view showing a circuit module according to Embodiment 1.

FIG. 1 is a schematic cross sectional view showing a circuit module according to Embodiment 1.

As shown in FIG. 1, a circuit module 100 according to the present embodiment has a flat dielectric material container main body formed of a ceramic substrate (which is hereinafter referred to as a ceramic carrier substrate) 1, a ceramic substrate pad 2 provided on the surface of the ceramic carrier substrate 1, electronic parts 3 mounted on a circuit region of the ceramic carrier substrate 1, and plural cavities 4 as concave regions having the electronic parts 3 housed therein, and also has a lid having a specific shape (which is hereinafter referred to as a stepped lid) 5 and solder 6, with which the bottom surface of the stepped lid 5 is joined to the ceramic substrate pad 2.

Figure 2:
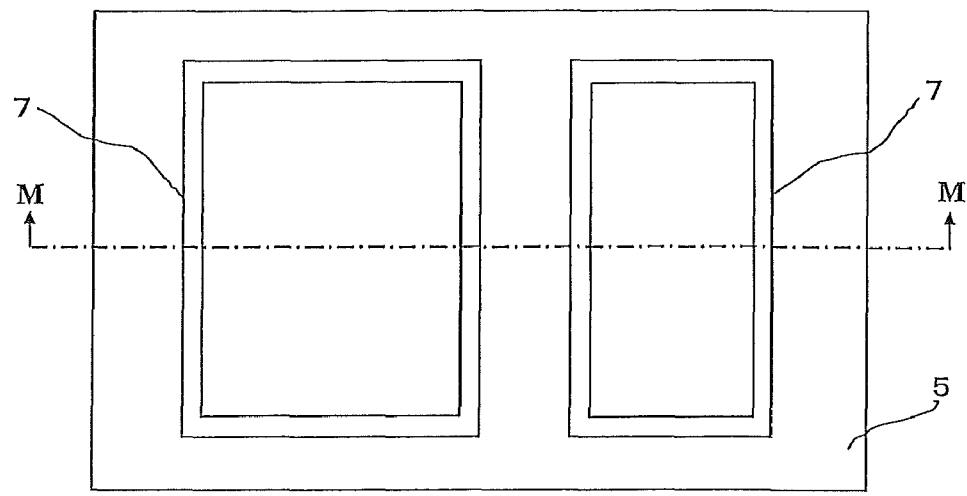
FIG. 2A is a schematic plane view showing a stepped lid used in the circuit module according to Embodiment 1 viewed from the side where a cavity is provided.
FIG. 2B is a schematic cross sectional view taken along line M-M in FIG. 2A.
Figure 2:
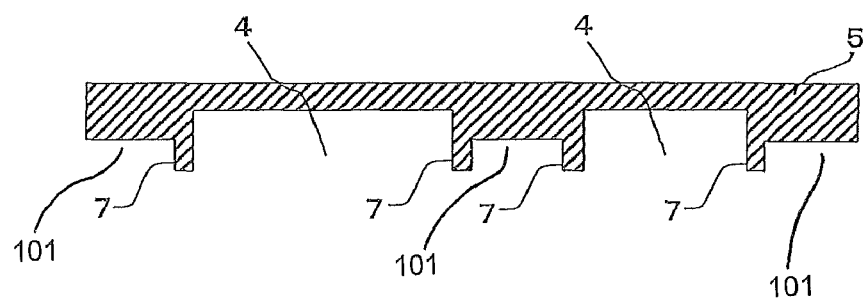

FIG. 2A is a schematic plane view showing the stepped lid 5 used in the circuit module 100 according to the present embodiment viewed from the side where the cavities are provided, and FIG. 2B is a schematic cross sectional view on line M-M in FIG. 2A.

As shown in FIGS. 2A and 2B, the bottom surface of the stepped lid 5 has steps, whereby an edge of the bottom surface of the stepped lid 5 on the side of the cavity 4 forms protrusions 7, and areas of the stepped lid 5 other than the protrusion 7 forms dents 101. The protrusion 7 surrounds the cavity 4.

In the circuit module 100 of the present embodiment, the protrusion 7 on the bottom surface of the stepped lid 5 is in contact with the ceramic carrier substrate 1, and the dents on the bottom surface of the stepped lid 5 are joined to the ceramic substrate pads 2 with the solder 6. A prescribed distance is provided between the protrusions 7 and the ceramic substrate pads 2, and the side of the protrusions 7 opposite to the cavity 4 is not entirely joined with the solder 6, but gaps 8 are provided.

In the circuit module 100 of the embodiment, an LTCC substrate having electroconductive layers on the surface and interior thereof is used as the ceramic carrier substrate 1, and Kovar, for example, is used as the metallic stepped lid 5.

In the case where the ceramic carrier substrate 1 is an LTCC substrate having a linear expansion coefficient of about 5.5 ppm/°C., it is preferred from the standpoint of reliability of the circuit module 100 that Kovar having a linear expansion coefficient of 4.7 ppm/°C., which is close to the linear expansion coefficient of the ceramic carrier substrate 1, is used as the stepped lid 5 since thermal stress of the stepped lid 5 is reduced upon joining with solder.

Figure 3:
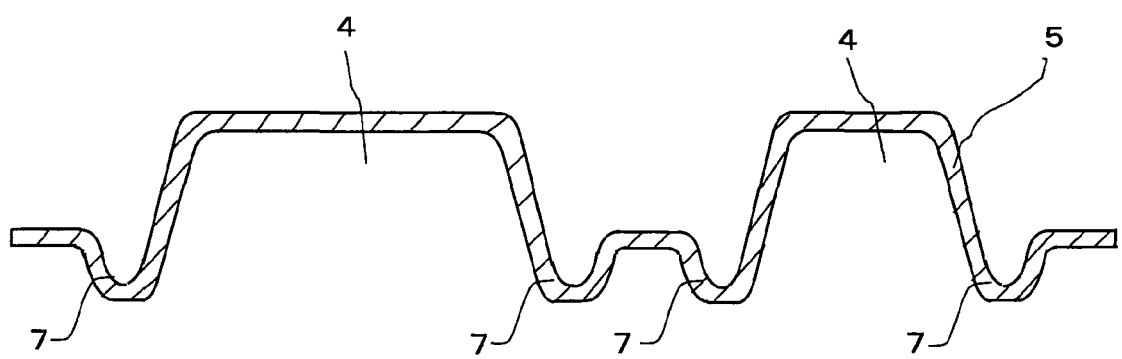
FIG. 3 is a schematic cross sectional view showing a stepped lid produced by press work used in the circuit module according to Embodiment 1.

The metallic stepped lid 5 shown in FIGS. 2A and 2B is produced by etching, MIM (metal injection molding), casting or the like. A metallic stepped lid 5 produced by press work, a schematic cross sectional view of which is shown in FIG. 3, may also be used.

The stepped lid 5 formed of Kovar is preferably subjected to plating, for example, gold plating with nickel underlayer for improving wettability of solder and for preventing rust. The thickness of the gold plating is preferably 0.1 μm or less, for example, with flash gold plating from the standpoint of cost. A small thickness of the gold plating suppresses formation of an intermetallic compound with tin, which is a major component of solder, to improve the reliability of joining with solder.

The stepped lid 5 having been subjected to gold plating with nickel underlayer facilitates preliminary fixation of the stepped lid 5 upon producing the circuit module.

The stepped lid 5 formed of Kovar may be subjected only to nickel plating. The stepped lid 5 having only nickel plating can be used after treating in a hydrogen reduction furnace or a special furnace having an extremely low oxygen concentration (for example, about 10 ppm or less) to prevent formation of an oxide layer deteriorating wettability of solder on the surface of the nickel plating.

As the solder 6, for example, Sn-3Ag-0.5Cu solder may be used. The ceramic substrate pad 2 may be formed with such a material that has electroconductivity and is capable of forming a solder precoating layer.

A process for producing the circuit module 100 of the present embodiment will be described.

FIGS. 4A to 4F are schematic cross sectional views showing the production process of the circuit module 100 of the present embodiment.

Figure 4:
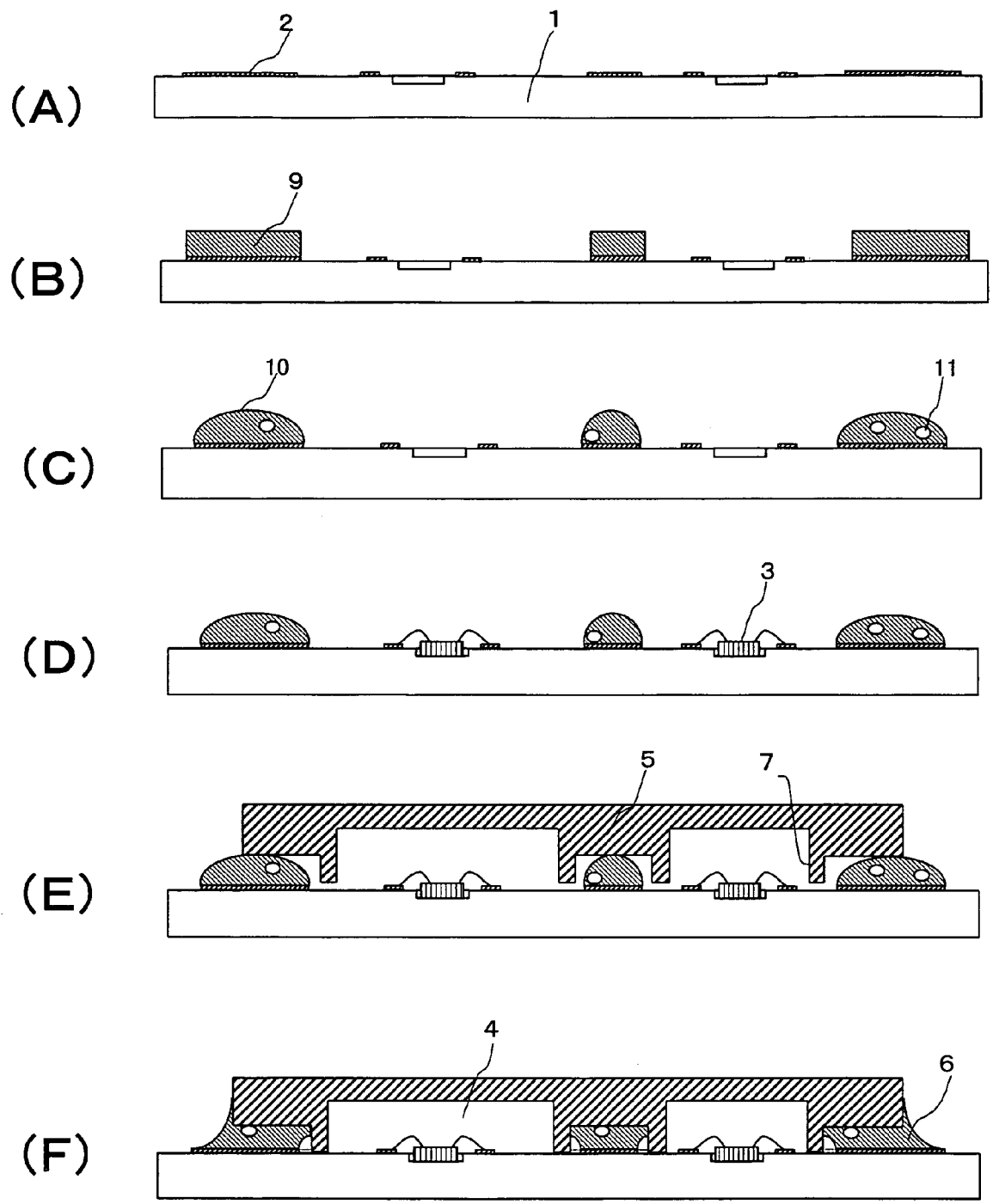
FIGS. 4A to 4F are schematic cross sectional views showing a production process of the circuit module according to Embodiment 1.

As shown in FIG. 4A, as a preliminary step, a ceramic carrier substrate 1 having a ceramic substrate pad 2 capable of being precoated with solder is prepared. Examples of the ceramic carrier substrate 1 to be prepared include one having a dimension of 18 mm in length, 17 mm in width and 0.7 mm in thickness.

As shown in FIG. 4B, as a solder paste coating step, a solder paste is fed with a printing stencil having a thickness of about 150 μm to form a solder paste layer 9 on the ceramic substrate pad 2.

As a precoated solder forming step, the ceramic carrier substrate 1 having the solder paste layers 9 formed on the ceramic substrate pads 2 is heated in a reflow furnace (which is not shown in the figures) to melt once the solder. After heating, the solder is solidified by cooling to form a precoated solder layer 10 as shown in FIG. 4C. The precoated solder layer 10 thus formed has a dome shape having a maximum thickness (height) of about 130 μm.

The most portion of the flux contained in the solder paste is excluded and moved to the surface or the surrounding of the precoated solder layer 10 through difference in specific gravity from solder at the time when the solder is melted by reflowing.

However, only a small portion of the flux is left in the solder layer through foaming and vibration associated with volatilization of a solvent contained in the flux, vibration caused by a transporting mechanism of the reflow furnace, convection of the molten solder, and the like, and remains as a void 11 in the precoated solder layer 10 as shown in FIG. 4C.

At the time after completing the precoated solder forming step, unnecessary flux covers the precoated solder layer 10, but is dissolved and removed by washing the ceramic carrier substrate 1 with an organic solvent or the like, and no flux remains on the surface of the precoated solder layer 10 as shown in FIG. 4C.

As a mounting step of an electronic part, as shown in FIG. 4D, electronic parts (such as a part or a semiconductor device) 3 are mounted on prescribed positions on the ceramic carrier substrate 1 having the precoated solder layer 10 formed on the ceramic substrate pad 2.

In general, the electronic parts 3 are mounted by die-bonding with a resin adhesive or the like (which is not shown in the figures), and after hardening the adhesive, connecting electrodes with gold wire or the like.

As a preliminarily fixing step of the stepped lid 5 to the ceramic carrier substrate 1, the stepped lid 5 is firstly prepared. For example, the stepped lid 5 having a dimension of 16 mm in length, 15 mm in width and 1.0 mm in thickness is prepared for the ceramic carrier substrate 1 having the aforementioned dimension.

The precoated solder layers 10 of the ceramic carrier substrate 1 and the joining parts of the stepped lid 5 are aligned by using a positioning device or a jig.

As shown in FIG. 4E, the stepped lid 5 is preliminarily fixed to the precoated solder layer 10 with a pressure fixing jig, such as a spring or a clip (which is not shown in the figures).

As a joining step of the stepped lid 5 to the ceramic carrier substrate 1, the ceramic carrier substrate 1 having the stepped lid 5 preliminarily fixed thereto is placed in a reflow furnace. The interior of the reflow furnace is made to be a low oxygen concentration (for example, an oxygen concentration of 1,000 ppm) necessary for carrying out soldering without flux (fluxless soldering), and the temperature of the reflow furnace is increased to a temperature exceeding the melting temperature of the solder (for example, 220° C. or more for Sn-3Ag-0.5Cu solder). A high concentration nitrogen atmosphere is used for decreasing the oxygen concentration inside the reflow furnace.

The precoated solder layer 10 is remelted (reflowed) in the reflow furnace having a low oxygen concentration, whereby the joining part of the stepped lid 5 is pressed into the molten solder with the pressure fixing jig to join the stepped lid 5 to the ceramic carrier substrate 1 with the solder 6. Thereafter, the solder 6 is solidified by cooling to provide the circuit module 100 as shown in FIG. 4F.

For joining the stepped lid 5 and the ceramic carrier substrate 1 with the solder, a special lid mounting device having a heating and pressurizing mechanism and a chamber capable of retaining a nitrogen atmosphere may be used instead of the reflow furnace having a low oxygen concentration.

In the production process of the circuit module 100 according to the present embodiment, the electronic parts are mounted after forming the precoated solder layer, but may be mounted at any time before carrying out the preliminarily fixing step of the stepped lid 5 to the ceramic carrier substrate 1.

The circuit module 100 according to the present embodiment has such a structure in that solder balls and flux are prevented from being scattered within the space inside the cavity 4, and the production process thereof is such a method in that solder balls and flux are prevented from being scattered within the space inside the cavity 4. The mechanisms therefor will be described below.

Figure 5:
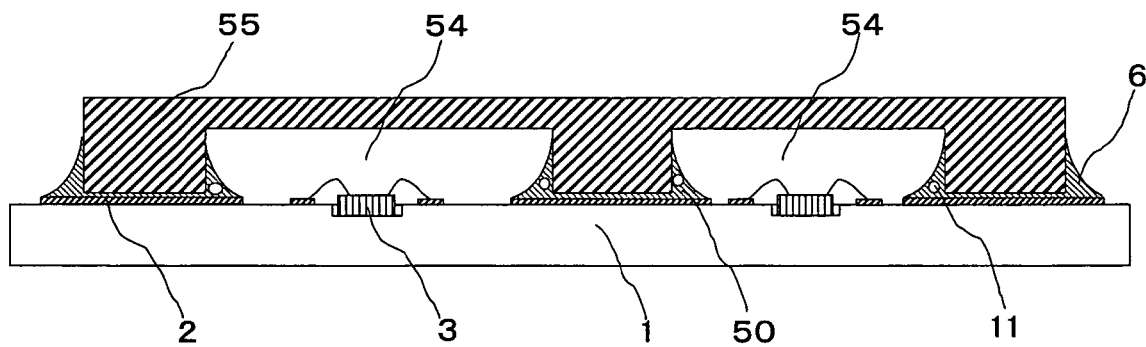
FIG. 5 is a schematic cross sectional view showing a circuit module using a lid having no step on the bottom surface thereof.

FIG. 5 is a schematic cross sectional view showing a circuit module 500 using a lid 55 having no step on the bottom surface thereof.

As shown in FIG. 5, the circuit module 500 has the same constitution as the circuit module 100 of the present embodiment except that: the bottom surface of the lid 55 is positioned immediately above ceramic substrate pads 2 of the ceramic carrier substrate 1; the bottom surface of the lid 55 is flat without protrusion; the width of the bottom surface is smaller than the width of the ceramic substrate pad 2; and solder fillets 50 are formed on the wall of the cavity 54 facing the space inside (which is hereinafter referred to as an inner wall surface) and the wall opposite to the inner wall surface (which is hereinafter referred to as an outer wall surface).

In the circuit module 500 having the aforementioned structure, voids incorporated in the precoated solder layer burst upon pressing the bottom surface of the lid 55 into the molten precoated solder layer with an external force from the pressure fixing jig for joining the lid 55 and the ceramic carrier substrate 1, and fine particles of the molten liquid solder and the remaining flux component are scattered within the cavity 54. The fine particles of the molten liquid solder and the remaining flux component are attached to the wiring, the mounted electronic parts and the surfaces of semiconductor devices and the circuit connecting parts inside the cavity 54, or remain as solid foreign matters moving inside the cavity 54. Particularly in the structure shown in FIG. 5, in which a solder fillet 50 is formed on the inner wall surface of the cavity 54, the solder is exposed inside the cavity 54, which brings about scattering of the fine particles of the solder and the remaining flux component inside the cavity 54.

In the case where the solder is scattered, short circuit occurs, and in the case where the flux is scattered, corrosion or the like problem occurs, whereby the circuit module is deteriorated in reliability.

In the circuit module 100 of the present embodiment, on the other hand, the edge of the bottom surface of the stepped lid 5 forms the protrusion 7 on the side of the cavity 4, and the prescribed distance is provided between the protrusion 7 and the ceramic substrate pad 2 to prevent the protrusion 7 and the ceramic substrate pad 2 from being in direct contact with each other. Accordingly, in the case where the dents on the bottom surface of the stepped lid 5 are pressed into the molten precoated solder layer with an external force from the pressure fixing jig, the protrusion 7 on the bottom surface is immediately in contact with the surface of the ceramic carrier substrate 1, whereby the interior of the cavity 4 is completely shielded from the solder 6, and the solder 6 is not exposed to the interior of the cavity 4 of the stepped lid 5. Furthermore, the distance is provided between the protrusion 7 and the ceramic substrate pads 2, and the stepped lid 5 is joined with the solder 6 in the place apart from the interior of the cavity 4, whereby the molten solder can be prevented from invading into the cavity 4 through under the protrusion 7.

Owing to the structure of the circuit module 100 of the present embodiment, in which the solder 6 is prevented from being exposed to the interior of the cavity by providing the protrusions 7 on the bottom surface of the stepped lid 5, even in the case where voids incorporated in the precoated solder layer burst, fine particles of the molten liquid solder and the remaining flux component can be prevented from being scattered within the cavity 4, and high reliability can be obtained without short circuit or corrosion due to the scattered substances.

The production process of the circuit module of the present embodiment can provide such a highly reliable circuit module in that fine particles of the molten liquid solder and the remaining flux component are not scattered within the cavity 4 upon producing.

The stepped lid 5 has another advantage in that owing to the protrusion 7 provided on the bottom surface of the stepped lid 5, the stepped lid 5 is not subducted beyond necessity even with a large pressing force applied from a pressure fixing jig such as a spring or a clip.

The following evaluation test was carried out for confirming the advantages of the circuit module 100 of the present embodiment.

20 pieces each of the circuit module 100 of the present embodiment as evaluation samples and the circuit module 500 as comparative samples were prepared.

As the first evaluation test, a PIND test (particle impact noise detection test) was carried out according to the MIL Standard (MIL STD 883, method 2020) for detecting movable foreign matters, such as solder and flux fragments not attached inside the cavity.

As the second evaluation test, all the evaluation samples and the comparative samples having been subjected to the PIND test were visually observed for finding foreign matters inside the cavity.

The visual observation of foreign matters was carried out in the following manner. The lid was ground from above until the top part of the lid becomes a thin film having a thickness of 50 μm or less, and then the top part was cut and opened with a sharp blade. The presence of foreign matters attached to the wiring and gold wire of the ceramic carrier substrate 1 was confirmed with a light microscope having high magnification. For the evaluation samples, the presence of a solder fillet formed on the inner wall surface of the cavity was confirmed, in addition to the presence of the attached foreign matters.

The evaluation results of the evaluation samples and the comparative samples are shown in Table 1 below.

It was understood from Table 1 that PIND failure was found in 4 pieces, and attachment of foreign matters was found in 2 pieces among 20 pieces of the comparative samples, but among all 20 pieces of the evaluation samples, PIND failure, attachment of foreign matters and formation of solder fillet were not found.

Accordingly, it was confirmed that the circuit module 100 of the present embodiment is such a highly reliable circuit module that suffers no scattered substance within the cavity 4 of the stepped lid 5.

The stepped lid 5 used for describing the circuit module 100 of the present embodiment has two cavities, but the invention is not limited thereto, and the number of cavities may be one or may be three or more unless they cannot be provided dimensionally.

TABLE 1

Result of Evaluation test

| Test | Evaluation samples (piece) | Comparative samples (piece) |
| --- | --- | --- |
| Number of samples suffering failure in PIND test | 0 | 4 |
| Number of samples suffering attachment of foreign matters | 0 | 2 |
| Number of samples suffering formation of fillet | 0 | — |

Total number of samples: 20 for each

Embodiment 2

FIG. 6A is a schematic plane view showing a stepped lid used in a circuit module according to Embodiment 2 viewed from the side where a cavity is provided, and FIG. 6B is a schematic cross sectional view taken along line N-N in FIG. 6A.

Figure 6:
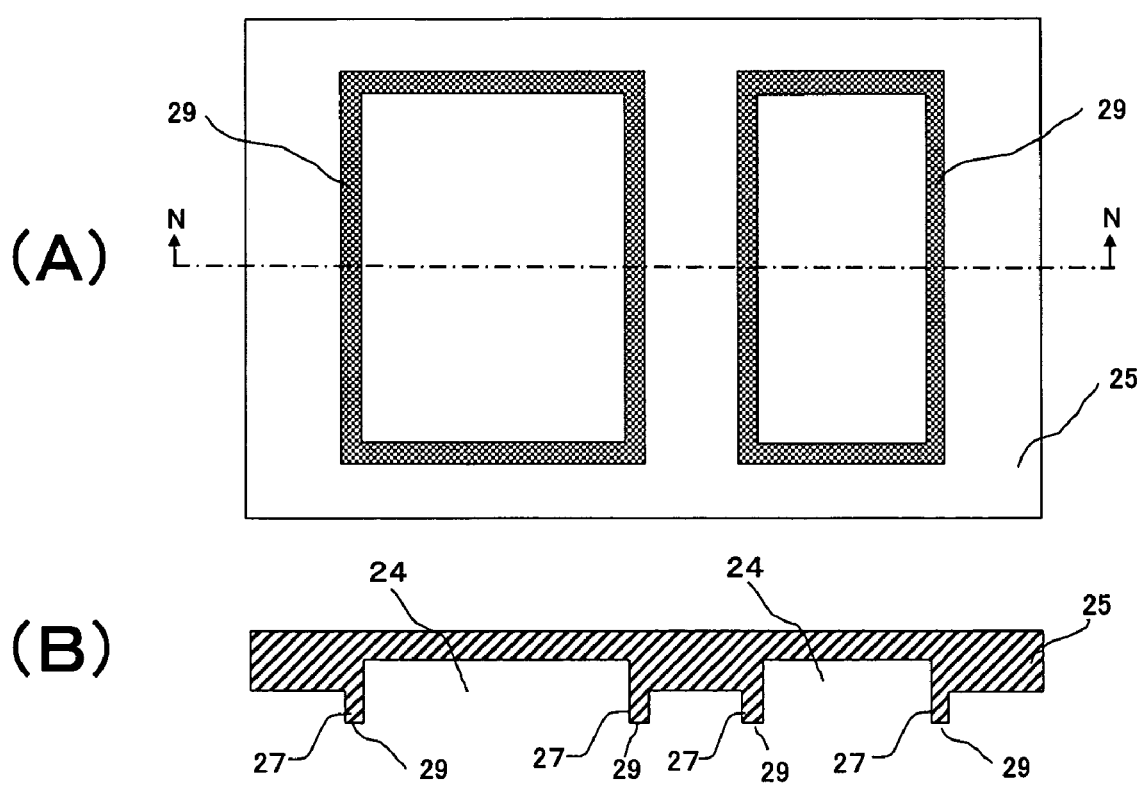
FIG. 6A is a schematic plane view showing a stepped lid used in a circuit module according to Embodiment 2 viewed from the side where a cavity is provided.
FIG. 6B is a schematic cross sectional view taken along line N-N in FIG. 6A.

The circuit module of Embodiment 2 is the same as the circuit module of Embodiment 1 except for using a stepped lid 25 having been subjected to gold plating on the entire surface except for surfaces 29 of protrusions 27 on the bottom surface thereof in contact with the ceramic carrier substrate 1 as shown in FIG. 6.

The stepped lid 25 having been subjected to gold plating on the entire surface except for the surface 29 of the protrusion 27 on the bottom surface in contact with the ceramic carrier substrate 1 can be produced by removing the gold plating on the surface 29 in contact with the ceramic carrier substrate 1 from the stepped lid 5 having been subjected to gold plating with nickel underlayer in Embodiment 1. For example, a method for removing the gold plating includes a removing method due to using a laser and a removing method due to mechanically cutting.

The circuit module of the present embodiment has no gold plating on the surfaces 29 of the protrusions 27 on the bottom surface of the stepped lid 25 in contact with the ceramic carrier substrate 1. Accordingly, such a phenomenon can be prevented from occurring in that overflowing molten solder is spread on the gold plated surface through minute gaps of several micrometers or less to invade the interior of the cavity 24, which may arise in the case where the heating time in the reflow furnace at a temperature exceeding the melting temperature of the solder exceeds 1 minute, and the case where the amount of the precoated solder is too large.

The spread solder does not bring about scattering of foreign matters since there is no void, but the circuit module of the present embodiment can be prevented from suffering a problem that may occur due to the solder itself spread into the cavity 24.

Embodiment 3

A process for producing the circuit module of Embodiment 3 is the same as the process for producing the circuit module of Embodiment 1 except that the production process further include, immediately before preliminarily fixing the gold plated stepped lid 5 and the precoated solder layer 10 formed on the ceramic carrier substrate 1, a step of preliminarily joining the stepped lid 5 to the precoated solder layer 10 after aligning the stepped lid 5 with the precoated solder layer 10.

Figure 7:
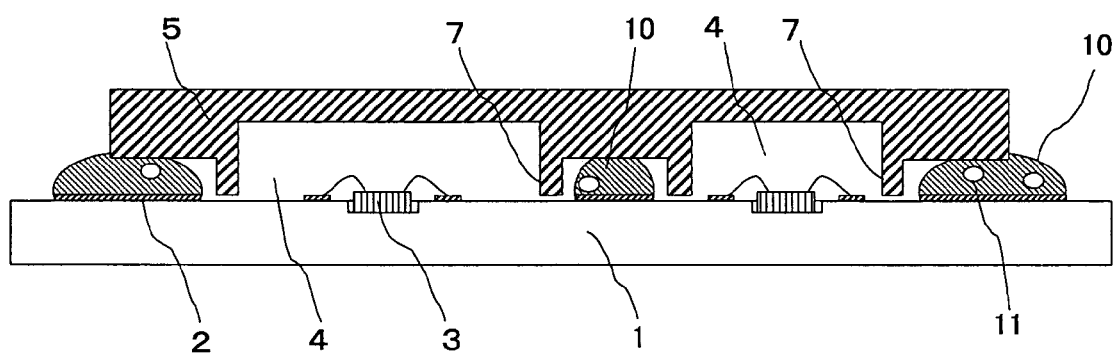
FIG. 7 is a schematic cross sectional view showing a state in a production process of a circuit module according to Embodiment 3 where a stepped lid is preliminarily joined to precoated solder layers.

For example, in the case of using Sn-3Ag-0.5Cu solder, the stepped lid 5 having been aligned with the precoated solder layer 10 is made in contact with the precoated solder layer 10 by applying a load of about from 500 g to 2 kg for from several seconds to several tens seconds in an environment of a temperature range (210° C. or more and less than 220° C.) that is slightly lower than 220° C., the melting point of the solder. The precoated solder layer 10 is thus locally softened, whereby the stepped lid 5 is preliminarily joined to the precoated solder layer 10 as shown in FIG. 7.

The temperature for the preliminary joining in the present embodiment is a temperature range that is slightly lower than 220° C., and in general, depending on a melting point of solder used, a temperature range that is slightly lower than the melting point (from a temperature lower than the melting point by 10° C. to a temperature less than the melting point) is appropriately used.

In the production process of the circuit module of the present embodiment, a step of preliminarily joining the stepped lid 5 to the precoated solder layer 10 is provided for preliminarily joining the stepped lid 5 to the precoated solder layer 10. Accordingly, positional deviation of the stepped lid 5 due to errors in handling can be prevented from occurring in the preparatory stage before reflowing for joining the stepped lid 5 to the ceramic carrier substrate 1, whereby the yield in production of circuit modules can be improved.

The step of mounting electronic parts is provided before the preliminarily fixing step in the production process of the circuit module in Embodiment 1, but in the present embodiment, the mounting step may be carried out at any time before the preliminarily joining step.

Embodiment 4

Figure 8:
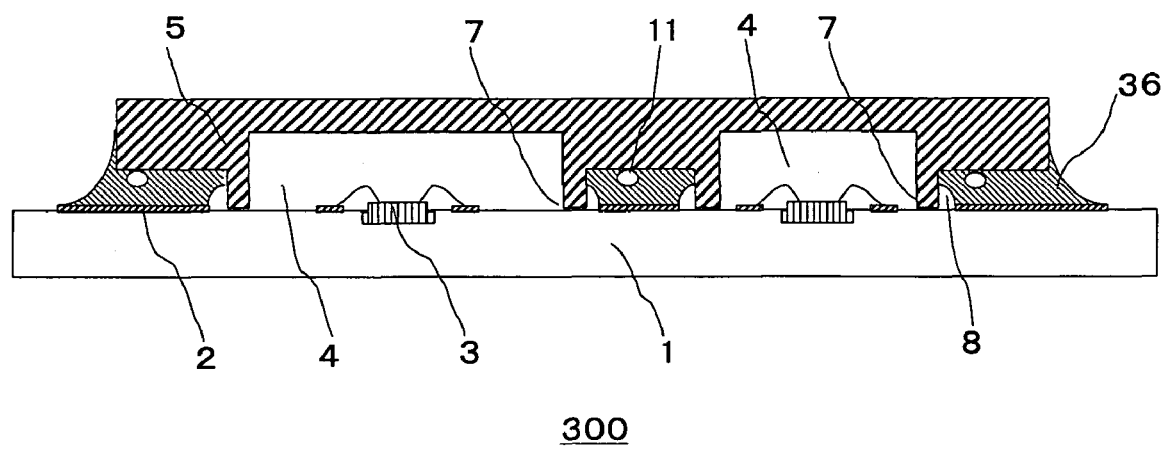
FIG. 8 is a cross sectional view showing a circuit module according to Embodiment 4.

FIG. 8 is a cross sectional view showing a circuit module according to Embodiment 4.

As shown in FIG. 8, the circuit module 300 of Embodiment 4 is the same as the circuit module of Embodiment 1 except for using an electroconductive resin 36 for joining the stepped lid 5 to the ceramic carrier substrate 1.

Examples of the electroconductive resin 36 used in the circuit module 300 of the present embodiment include an epoxy resin containing silver particles.

The stepped lid 5 is preferably one having only nickel plating from the standpoint of adhesiveness to the electroconductive resin 36.

A process for producing the circuit module 300 of the present embodiment will be described.

The same ceramic carrier substrate 1 as in the production of the circuit module of Embodiment 1 is prepared.

As an electroconductive resin coating step, a liquid electroconductive resin in a not hardened state is fed by using a dispenser to form an electroconductive resin layer on the ceramic substrate pads 2. The electroconductive resin is then semi-hardened by preliminarily heating to form a solid precoated electroconductive resin layer. The semi-hardened precoated electroconductive resin layer is obtained by terminating hardening reaction at a stage before completely hardening the resin, and is again in a liquid state by heating again.

An electronic parts (such as a part or a semiconductor device) 3 is mounted on a prescribed position on the ceramic carrier substrate 1 in the same manner as in Embodiment 1.

The ceramic carrier substrate 1 having the precoated electroconductive resin layer formed thereon is fixed to a stage of a mounter equipped with a heating mechanism (which is not shown in the figures). The stepped lid 5 is picked up with a head of the mounter equipped with the heating mechanism. The joining part of the stepped lid 5 and the precoated electroconductive resin layer on the ceramic carrier substrate 1 are then aligned by using a positioning function of the mounter equipped with the heating mechanism.

The joining part of the stepped lid 5 is made in contact with the precoated electroconductive resin layer on the ceramic carrier substrate 1, and the head and the stage of the mounter equipped with the heating mechanism are heated to a temperature necessary for remelting the precoated electroconductive resin layer.

At the time when the precoated electroconductive resin layer is melted, the head is made to descend, whereby the joining part of the stepped lid 5 is pressed into the molten electroconductive resin layer.

The stepped lid 5 is retained until the electroconductive resin 36 is completely hardened, and the stepped lid 5 and the ceramic carrier substrate 1 are joined by adhering with the electroconductive resin 36, followed by cooling the head and the stage of the mounter equipped with the heating mechanism. After cooling, the completed circuit module 300 is taken out from the mounter equipped with the heating mechanism.

In the production process of the circuit module 300 according to the present embodiment, the electronic parts are mounted after forming the precoated electroconductive resin layer, but may be mounted at any time before fixing the ceramic carrier substrate 1 having the precoated electroconductive resin layer formed thereon to the stage of the mounter equipped with the heating mechanism.

In the circuit module 300 of the present embodiment and the production process thereof, voids are incorporated in the electroconductive resin layer upon forming the electroconductive resin layer on the ceramic substrate pad 2. The voids burst upon pressing the joining part of the stepped lid 5 into the precoated electroconductive resin layer having been remelted by heating, and a part of the resin in a molten state is separated and scattered.

In the circuit module of the present embodiment and the production process thereof, however, the stepped lid 5 used has the protrusion 7 that is provided on the bottom surface at the edge on the side of the cavity 4 to surround the cavity 4, whereby the resin can be prevented from being scattered within the cavity 4.

In the circuit module of the present embodiment and the production process thereof, the pressing force of the mounter equipped with the heating mechanism may not be particularly considered since the stepped lid 5 is used. For example, even in the case where the stepped lid 5 is pressed strongly, the protrusion 7 is in contact with the ceramic carrier substrate 1 to function as a spacer, whereby the adhesion surface of the stepped lid 5 can be prevented from being subducted beyond necessity to exclude the electroconductive resin externally.

Embodiment 5

A process for producing the circuit module of Embodiment 5 is the same as the process for producing the circuit module of Embodiment 4 except that the steps after carrying out the step of making the joining part of the stepped lid 5 into contact with the precoated electroconductive layer of the ceramic carrier substrate 1 contain a step of preliminarily adhering the stepped lid 5 to the ceramic carrier substrate 1 by heating only the head of the mounter equipped with the heating mechanism to heat only the stepped lid 5, whereby heat is conducted from the stepped lid 5 to the precoated electroconductive resin layer to soften locally only a part of the precoated electroconductive resin layer that is in contact with the stepped lid 5, and then cooling again the electroconductive resin layer, and a step of principally fixing the stepped lid 5 to the ceramic carrier substrate 1 by maintaining the stepped lid 5 having been preliminarily adhered and preliminarily fixed with a pressure fixing jig, such as a spring or a clip, at a high temperature in a heating and drying furnace to harden the electroconductive resin completely, then cooling the stepped lid 5 to room temperature, and taking the stepped lid 5 out from the heating and drying furnace.

In the present embodiment, the period of time required for preliminarily adhering varies depending on the kind of the electroconductive resin and the set temperature of the mounter equipped with the heating mechanism, and is generally from 1 second to several seconds.

In the production process of the circuit module of the present embodiment, the stepped lid 5 is preliminarily adhered to the ceramic carrier substrate 1, and thus the stepped lid 5 is prevented from being deviated or released upon handling. Accordingly, a large number of assemblies each having the stepped lid 5 preliminarily adhered to the ceramic carrier substrate 1 can be produced, and the large number of preliminarily adhered assemblies can be heated in a heating and drying furnace to harden the electroconductive resin of the large number of preliminarily adhered assemblies at one time for adhering and joining the stepped lid 5 to the ceramic carrier substrate 1, whereby the productivity of the circuit modules can be improved.

The circuit module according to the present invention is prevented from suffering invasion of foreign matters into a cavity, in which electronic parts are housed, and can be effectively applied to an electronic device demanded to have high reliability.

Various modifications and alterations of this invention will be apparent to those skilled in the art without departing from the scope and spirit of this invention, and it should be understood that this is not limited to the illustrative embodiments set forth herein.

What is claimed is:

1. A circuit module comprising a ceramic carrier substrate to carry electronic parts, ceramic substrate pads provided on a surface of the ceramic carrier substrate, and a lid having a cavity and a bottom surface joined to the ceramic substrate pads with solder, the lid being a stepped lid having protrusions adjacent to the cavity, and dents adjacent to the cavity with the protrusions intervening therebetween, the protrusions being in contact with the ceramic carrier substrate at a prescribed distance away from the ceramic substrate pad, and the dents being joined to the ceramic substrate pads with solder.

2. A circuit module comprising a ceramic carrier substrate to carry electronic parts, ceramic substrate pads provided on a surface of the ceramic carrier substrate, and a lid having a cavity and a bottom surface joined to the ceramic substrate pads with electroconductive resin, the lid being a stepped lid having protrusions adjacent to the cavity, and dents adjacent to the cavity with the protrusions intervening therebetween, the protrusions being in contact with the ceramic carrier substrate at a prescribed distance away from the ceramic substrate pad, and the dents being joined to the ceramic substrate pads with the electroconductive resin.

* * * * *